(12) United States Patent
Lo et al.

(10) Patent No.: US 6,504,393 B1
(45) Date of Patent: *Jan. 7, 2003

(54) METHODS AND APPARATUS FOR TESTING SEMICONDUCTOR AND INTEGRATED CIRCUIT STRUCTURES

(75) Inventors: Chiwoei Wayne Lo, Campbell, CA (US); Mariel Stoops, Santa Clara, CA (US); Christopher Graham Talbot, Menlo Park, CA (US)

(73) Assignee: Applied Materials, Inc., Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/892,734

(22) Filed: Jul. 15, 1997

(51) Int. Cl.[7] .............................................. G01R 31/26
(52) U.S. Cl. ........................ 324/765; 324/751; 250/310
(58) Field of Search ................................. 324/765, 751, 324/158.1, 71.3, 752, 753; 250/310, 307, 397, 492.2

(56) References Cited

U.S. PATENT DOCUMENTS

| | | | |
|---|---|---|---|
| 3,638,015 A | 1/1972 | Browning et al. | |
| 3,701,979 A | 10/1972 | Smith et al. | |
| 4,068,218 A | 1/1978 | Likuski | |

(List continued on next page.)

FOREIGN PATENT DOCUMENTS

| | | | |
|---|---|---|---|
| EP | 0 309 956 A | 4/1989 | |
| EP | 0 853 243 A | 7/1998 | |
| JP | 59 079544 A | 5/1984 | |
| JP | 60 136235 A | 7/1985 | |

OTHER PUBLICATIONS

Cass, Thomas R., "Use of the Voltage Contrast Effect for the Automatic Detection of Electrical Defects on In–Process Wafers", Technology Development Center, ICBD, Hewlett–Packard Co., Palo Alto, CA, KLA Yield Management Seminar, pp. 506–1 through 506–11. no available month.

Reimer, L., Image Formation in Low–Voltage Scanning Electron Microscopy, 1993, pp. 74–75. no month, year available.

*Primary Examiner*—Michael Sherry
*Assistant Examiner*—Minh N Tang
(74) *Attorney, Agent, or Firm*—Michael B. Einschlag

(57) ABSTRACT

A method of testing a semiconductor structure such as a finished or part-finished semiconductor wafer, a die on such a wafer, part of such a die, or even one functional element (e.g. a transistor or memory cell) of such a die. The method includes the steps of charging at least a part of the semiconductor structure; applying an electric field perpendicular to a surface of the structure while charging so as to determine charging potential and polarity (i.e. charging either positively or negatively); interrogating the structure including the charged part with a charged particle beam, such as an electron beam, so as to obtain voltage contrast data for the structure; and analyzing the data to determine the functionality of the element. Apparatus according to the invention for testing semiconductor structures, includes: a system for applying charge to at least part of the semiconductor structure, such as an electron beam, flood gun or mechanical probe; an electric field generator, typically an electrode spaced from the surface of the structure, which applies an electric field perpendicular to a surface of the structure so as to determine the potential and polarity of the charge applied to the element (i.e. positive or negative charge); a charged particle beam device such as an electron beam for interrogating the charged element; and a detector such as a secondary electron detector which obtains voltage contrast data from the structure on interrogation with the charged particle beam.

35 Claims, 10 Drawing Sheets

U.S. PATENT DOCUMENTS

| | | |
|---|---|---|
| 4,342,949 A | 8/1982 | Harte et al. |
| 4,415,851 A | 11/1983 | Langner et al. |
| 4,417,203 A | 11/1983 | Pfeiffer et al. |
| 4,443,278 A | 4/1984 | Zingher |
| 4,567,402 A | 1/1986 | Mourier |
| 4,575,630 A | 3/1986 | Lukianoff |
| 4,825,087 A | 4/1989 | Renau et al. |
| 4,843,330 A | 6/1989 | Golladay et al. |
| 4,855,673 A | 8/1989 | Todokoro |
| 4,896,045 A | 1/1990 | Okunuki et al. |
| 4,912,052 A | 3/1990 | Miyoshi et al. |
| 4,939,360 A | 7/1990 | Sakai |
| 4,943,769 A | 7/1990 | Golladay et al. |
| 4,972,083 A | 11/1990 | Taya et al. |
| 5,030,908 A | 7/1991 | Miyoshi et al. |
| 5,057,773 A | 10/1991 | Golladay et al. |
| 5,089,710 A | 2/1992 | Kikuchi et al. |
| 5,136,540 A | 8/1992 | Hayashi et al. |
| 5,148,034 A | 9/1992 | Koike |
| 5,187,371 A | 2/1993 | Matsui et al. |
| 5,214,289 A | 5/1993 | Betsui |
| 5,254,856 A | 10/1993 | Matsui et al. |
| 5,412,209 A | 5/1995 | Otaka et al. |
| 5,420,433 A | 5/1995 | Oae et al. |
| 5,442,183 A | 8/1995 | Matsui et al. |
| 5,502,306 A | 3/1996 | Meisburger et al. |
| 5,528,048 A | 6/1996 | Oae et al. |
| 5,578,821 A | 11/1996 | Meisberger et al. |
| 5,602,489 A | 2/1997 | El-Kareh et al. |
| 5,614,725 A | 3/1997 | Oae et al. |
| 5,872,358 A * | 2/1999 | Todokoro et al. ............ 250/310 |
| 5,986,263 A * | 11/1999 | Hiroi et al. .................. 250/310 |

* cited by examiner

METHODS AND APPARATUS FOR TESTING SEMICONDUCTOR AND INTEGRATED CIRCUIT STRUCTURES

FIELD OF THE INVENTION

The present invention relates to methods and apparatus for testing semiconductor structures such as those found in integrated circuits. In particular, the invention provides techniques by which finished or part-finished semiconductor wafers can be tested during the manufacturing process.

BACKGROUND OF THE INVENTION

Electron beam systems based on the voltage contrast principle have been developed for detecting open and short faults of conductors on multichip-module (NCM) substrates (see for example U.S. Pat. No. 4,415,851, U.S. Pat. No. 4,417,203 and U.S. Pat. No. 4,443,278) and flat panel displays. The basic operational principle is that the circuit conductor voltage can be determined from the intensity of the detected secondary electrons ("voltage contrast"); given this information it is possible to find open and short faults in the circuit patterns. In the examples given above, an electron beam is used to charge up a net (a chain of connected nodes) and the voltages on the nodes in this net or the nodes in the neighboring nets are subsequently examined. Since all nodes in the charged net are expected to charge up, any non-charged nodes indicate open faults. On the other hand, any charged up nodes in the near-by nets signal short faults. In case of testing flat panel displays, an electron beam is used to charge each pixel cell and the equilibrium potential is determined. Two different types of defects can be detected: open- or short-pixel. An open-pixel has a higher final charging potential when compared to a normal pixel while a short-pixel has a lower final charging potential.

Electron-beam voltage contrast has also been demonstrated for detecting open and short faults on unfinished semiconductor wafers which are invisible to optical inspection systems. To prevent beam-induced damage of the wafer, a low voltage beam has to be used. A high voltage beam will cause beam penetration damage and can charge the surface to a harmful high voltage; a low voltage beam, on the other hand, charges the surface positively, and the charging mechanism is self regulated to less than a few volts. A voltage contrast image shows distinction between floating metal lines (charged up positively) and grounded metal line to the substrate (uncharged). Because this system can only differentiate the two states, the detectable defects can be generalized into two types: should-be floating metal lines that are grounded because of a bad short to the substrate, or should-be grounded metal lines that are floating because of a broken connection. This technique is most suitable for detecting defects in circuit patterns which contain a mixture of floating and grounding conductors; which is often the case at the late stage of the fabrication. Unfortunately, when inspecting at a late stage, it can be very difficult to isolate defects when the metal lines have been connected into complex networks. To by-pass this limitation, some inspections are conducted in laboratories on wafers in the early stage of the fabrication (metal 1 and 2) by externally grounding certain metal lines. This approach, however, can only be done off-line and requires a skillful operator to achieve good results.

Other proposals for inspecting semiconductor wafers using charged particle beams are disclosed in copending patent application Ser. No. 08/782,740 (filed Jan. 13th, 1997), the contents of which are incorporated herein by reference, and in U.S. Pat. No. 5,578,821. U.S. Pat. No. 5,502,306 discloses the use of electron beams for inspecting masks. U.S. Pat. No. 5,578,821 describes the use of an electrode near to the surface of the substrate to establish a field-free region, the object being to avoid creating large potential differences between areas on the substrate.

Device critical dimensions are continuing to shrink and fabrication lines are increasingly adopting larger wafer sizes to cut average die manufacturing cost. This means that devices are more susceptible to contamination and processing imprecision and low yields are less tolerable due to high wafer cost and equipment capital. Increasingly, there is a demand for inspection techniques to detect defects and isolate the root cause at the earliest stage. However, no existing inspection tools or techniques are known which can detect defects in the fabrication of diffusion contacts and gate poly. These types of defects are not visible using optical microscopes or charged particle microscopes because they are hidden under the surface. Existing voltage contrast techniques are unable to find them because no difference in voltage contrast between the good and the bad open contacts; either bad or good contacts charge-up under the electron beam irradiation.

It is an object of the present invention to provide a technique which allows the detection of defects at an early stage of fabrication and overcome some or all of the limitations of the existing techniques.

SUMMARY OF THE INVENTION

The present invention provides a method of testing a semiconductor structure such as a finished or part-finished semiconductor wafer, a die on such a wafer, part of such a die, or even one functional element (e.g. a transistor or memory cell collectively known to those of ordinary skill in the art as active devices and which are comprised of interconnected structures such as poly gates, contacts and diffusions into the semiconductor wafer to form pn junctions.) of such a die. Those of ordinary skill in the art will recognize that each die on the wafer is an integrated circuit comprised of one or more active devices. The method comprises charging at least a part of the semiconductor structure; applying an electric field perpendicular to a surface of the structure while charging so as to determine charging potential and polarity (i.e. charging either positively or negatively); interrogating the structure including the chatted part with a charged particle beam, such as an electron beam, so as to obtain voltage contrast data for the structure; and analyzing the data to determine the functionality of the element.

Apparatus according to the invention for testing semiconductor structures, comprises: means for applying charge to at least part of the semiconductor structure, such as an electron beam, flood gun or mechanical probe; an electric field generator, typically an electrode spaced from the surface of the structure, which applies an electric field perpendicular to a surface of the structure so as to determine the potential and polarity of the charge applied to the element (i.e. positive or negative charge); a charged particle beam device such as an electron beam for interrogating the charged element; and a detector such as a secondary electron detector which obtains voltage contrast data from the structure on interrogation with the charged particle beam.

The present invention has the advantage that it provides for controlled positive and/or negative charging of the structure and so allows faults to be located which are either In invisible to previous techniques or would otherwise require Vss to be connected to be detected.

The preferred means for applying charge is an electron beam. This can be in the form of a relatively unfocussed flood gun if it desired to charge a large area of the structure, or focused beam where charging is to be in a specific area or of specific elements such as contact pads and the like. Other means for applying charge are focused ion beams and mechanical probes. It will be appreciated that where the term "electron beam" is used in this application, one or other of these alternatives might be used, depending on circumstances.

By providing for the application of an electric field perpendicular to the surface of the structure, it is possible to control the charging potential and polarity. The field can cause either more or less charged particles (electrons) to leave the surface than the number arriving from the charging means. In a particularly preferred embodiment, this is achieved using an electrode, which can be a grid or aperture plate according to requirements, to which a voltage is applied relative to the structure. This can be achieved by placing the structure on a sample plate and applying the voltage between the electrode and the plate. Either the plate or the electrode can be grounded according to requirements.

One particular advantage of the invention is the ability to provide a system which allows consecutive tests of the same structure with positive and negative charging (or vice versa). This allows verification of the performance of certain parts of the structure which might not show any fault with one polarity but show faults clearly with the opposite polarity.

Voltage contrast data can be presented in the form of a voltage contrast image for either automatic or visual analysis, or can be analyzed directly without the need to construct an image.

This invention provides a wafer inspection system which can be used both in-line and off-line which is based on the technology of charged particle voltage contrast. This allows wafer inspection to be conducted at as early a stage as diffusion-contact fabrication. The techniques can be used to determine open and short faults which are difficult to find using prior art voltage contrast techniques, optical wafer inspection systems, or any other inspection tools. The invention provides the opportunity to use dual polarity (positive and negative charging) voltage contrast for wafer inspection. In contrast, prior art voltage contrast techniques uses only positive charging voltage contrast. As will be explained below, it is desirable to be able to inspect a wafer using both positive and negative voltage contrast because each reveals a different type of information. The present invention overcomes the problems of the prior art systems in their inability to provide a negative charge in a controlled manner. In particular, the invention has the advantage of avoiding the use of a high energy primary electron beam (the surface will charge negatively with a high energy beam because more electrons enter into the substrate than exit). This mechanism, however, is not acceptable for most semiconductor processes because deep penetration of high voltage electrons can damage the device and the surface can charge up to an uncontrollable voltage (up to hundreds or thousands of volts until the beam is deflected or reflected, or the occurrence of an electrical break down) which can destroy the device. This is not a problem with the present invention.

The means for applying charge and the electric field generator of the present invention together comprise a charge control unit which can charge the wafer positively or negatively in a well-controlled manner. The charge control mechanism employed is acceptable for wafer inspection because the electron beam is always operating at low voltages for both positive and negative charging and the charging process is self-regulated for both positive and negative charging, therefore, is well under control. The basic principle of the charging mechanism is that by applying an external electrical field perpendicular to the wafer surface, it is possible to control the escaped secondary electron current to be greater or less than the primary electron beam current so as to charge the surface either positively or negatively with the same low voltage electron beam (rather than alternating between low and high voltage beams). When applying an external electrical field to prevent the secondary electrons from leaving the surface, the surface can be charged to a more negative potential relative to the substrate. On the other hand, by reversing the polarity of the electrical field, the escaped secondary electron current increases, and therefore charges the surface more positively. This technique inherits the self-regulation of low voltage beam charging. When irradiating the surface with a low voltage beam (without an external electric field), the surface continues to charge positively but decreases over time. This is due to the increasing positive potential which attracts more secondary electrons back to the surface. The charging process reaches an equilibrium when the escaped secondary electron flux equals the incoming primary electron flux (assuming no leakage through the substrate). In case of applying an external electric field, the surface readjusts to another equilibrium potential which counters the influence of the external field on the secondary electron emission. For precise voltage control, the charge control unit needs to be calibrated to link the bias voltage to the surface charging potential. This can be accomplished by charging a test sample, which contains well insulated metal lines, at various bias voltages. The method for measuring the surface charging potential will be discussed below.

Other possible means for applying charge include the use of an ultra high current density, low energy electron beam, and the use of ultraviolet radiation. In the first case, a beam of ~1 keV electrons having a very high current density can charge a surface negatively instead of the usual positive charging observed with electron beam irradiation. Depletion of available secondary electrons is believed to be the reason for this and the process is not self regulating. Irradiation with UV light will cause the surface to charge positively due to photoelectrons leaving the surface. This method is self regulating as the buildup of positive voltage will eventually prevent electrons from leaving the surface.

DESCRIPTION OF THE PREFERRED EMBODIMENTS

Figure 1:
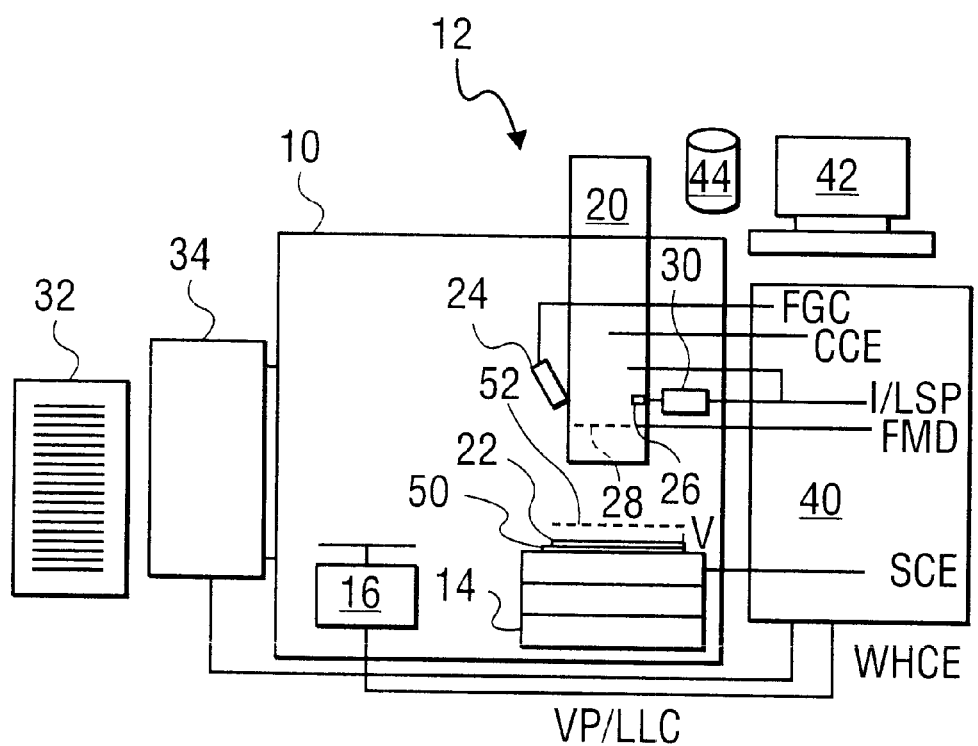
FIG. 1 shows one embodiment of a system according to the present invention.

The system shown in FIG. 1 is a modified version of that shown in U.S. Ser. No. 08/782,740 (shown inverted for clarity) and comprises a vacuum chamber 10 housing an electron beam device 12, a stage 14, and a wafer handling robot 16. The electron beam device comprises a scanning electron microscope column 20, such as is used in IC e-beam probing devices such as the IDS 10000 available from Schlumberger Technologies, Inc. Automatic Test Equipment division of San Jose, Calif. The column 20 is positioned above the stage 14 which supports a semiconductor IC manufacturing wafer 22 on a sample plate 50 which is connected via a voltage source v to a bias electrode 52 which is interposed between the sample and the column 20. The stage 14 allows movement in two directions (an X-Y stage). The stage 14 is arranged such that any part of the wafer 22 can be brought within the field of view of the column 20. A low energy (~1 keV) electron source 24 is inserted from the side of the column and arranged to flood the wafer 22 in the field of view of the column 20 with electrons. A secondary electron detector 26 is provided to detect secondary electrons emitted from the surface of the wafer 22 when the electron beam is scanned over it. In order to optimize the ability of the detector 26 to detect voltage contrast between floating and grounded structures in the wafer, a biased filter mesh 28 is provided between the wafer 22 and the detector 26, the mesh 28 being held at a bias voltage such that only electrons with higher than a predetermined energy will pass to the detector 26 and be detected. The response of the detector is enhanced by a photomultiplier tube 30.

The wafer 22 is positioned on the stage 14 by means of the handler robot 16 which can be located within the chamber 10 as shown or outside the chamber as appropriate. Such robots are common in semiconductor manufacturing processes. In order to be accessible to the robot 16, a cassette of wafers 32 is loaded into a load lock 34 which can then be sealed and lowered to the pressure of the chamber 10. This reduces the need to bring the chamber up to atmospheric pressure each time a new cassette of wafers is inserted. A control system 40, itself operated under control from a computer 42 including a database 44 of CAD design data and optimized line scan recipes, controls operation of this system. The control system includes column control electronics CCE, image/line scan processor I/LSP, filter mesh drive FMD, stage control electronics SCE, wafer handler control electronics WHCE, vacuum pump and load lock controls VP/LLC and flood gun controls FGC.

The column 20, flood gun 24 and the sample plate 50 bias electrode 52 together form a charge control unit which serves to control the voltage and polarity of the charge applied to the wafer. The charge control unit can comprise two different functional configurations: Global charge control module (GCCM) which comprises the flood gun 24, the sample plate 50 and the bias electrode 52; and local charge control module (LCCM) which comprises the primary column beam 20, the sample plate 50 and the bias electrode 52. The GCCM is used for a large area charging while the LCCM is used for localized charging. The flood gun in the GCCM is chosen to operate at a voltage between the two cross-overs of the surface secondary electron emission; in this condition, the surface is always charged up positively with the absence of an external electric field. The bias electrode can be a grid or a plate with one ~r more apertures. The wafer is placed on the sample plate so as to be electrically conductive with each other. To charge up the wafer, an electric field needs to be applied perpendicular to the wafer surface. This is achieved by applying a voltage between the bias electrode and the sample plate. For instance, the sample plate is grounded while the bias electrode voltage switches between two voltage of different polarities. During flood, any floating portion of the irradiated area charges to a pre-determined positive (positive voltage at the bias) or negative (negative voltage at the bias) voltage relative to the substrate. Alternatively, the bias electrode can be grounded while the sample plate voltage is varied. Any floating portion charges up positively (negative voltage at sample plate) or negatively (positive voltage at sample plate) relative to the substrate. The LCCM is very similar to GCCM except that the flood gun is now replaced by a focused beam. The focused beam is used to selectively charge up a much smaller structures than GCCM. Note that it is optional to have either separate bias electrodes or one integrated bias electrode for both LCCM and GCCM. In addition, the present invention could be used, in either the GCCM mode, the LCCM mode or some combination of both, to charge the wafer to more than one potential having the same polarity.

An alternative scheme for negatively charging-up floating portions of the sample in a controlled manner is flooding with ultra-low (a few volts relative to the sample, e.g. 20 V)) voltage electron beam(s). When irradiating with ultra-low voltage beam, the surface charges up negatively because of very low secondary electrons yield. Charging reaches equilibrium when the surface potential is negative enough to repel the incoming flood-electrons. It is necessary to be able focus ultra-low electrons to achieve the desired charge density One approach is to allow the flood electrons to travel at high energy while in the gun. The electrons are retarded before they reach the sample surface.

Figure 2:
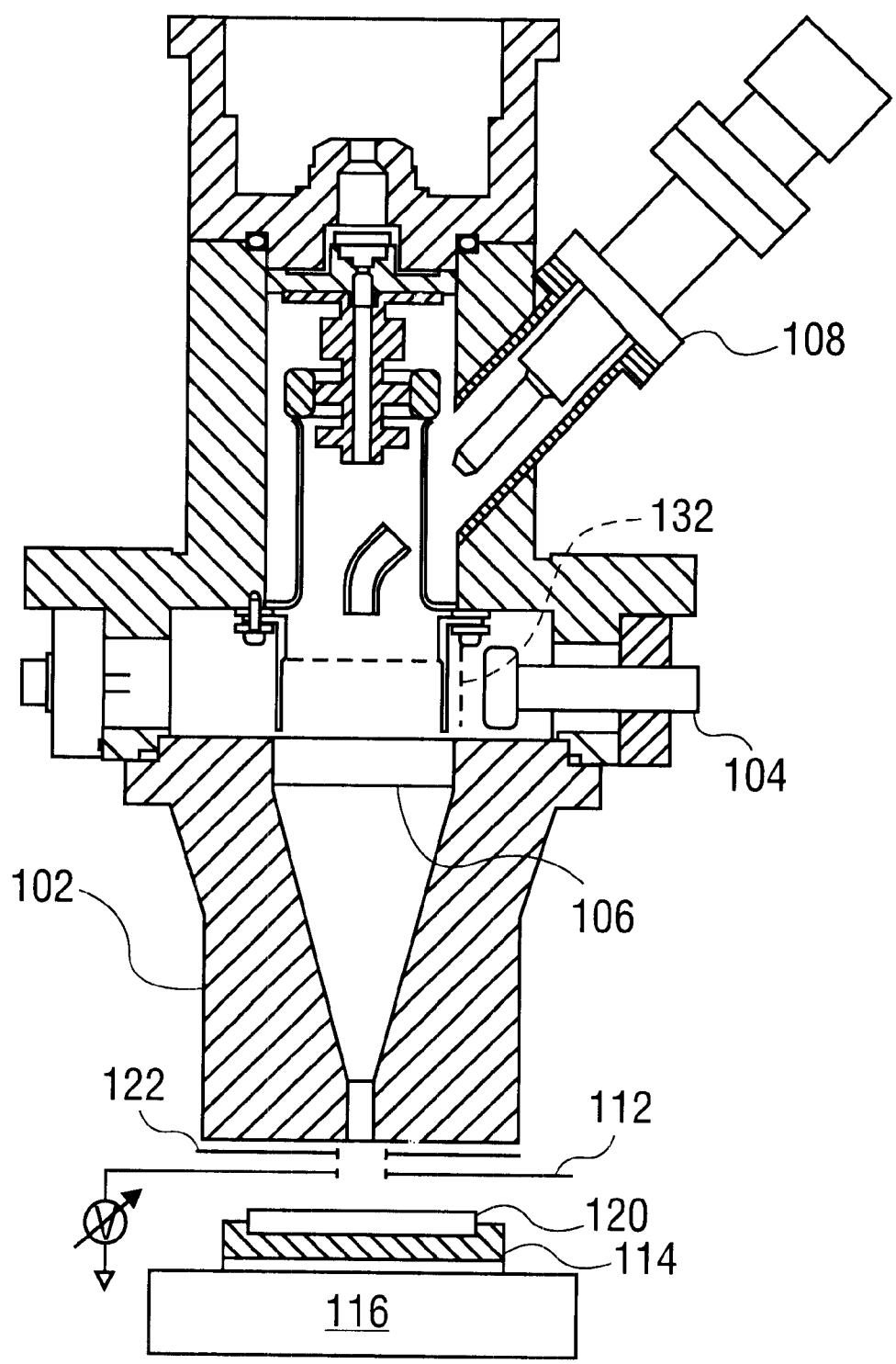
FIGS. 2 and 2(a) show part views of another embodiment of the present invention.
Figure 2A:
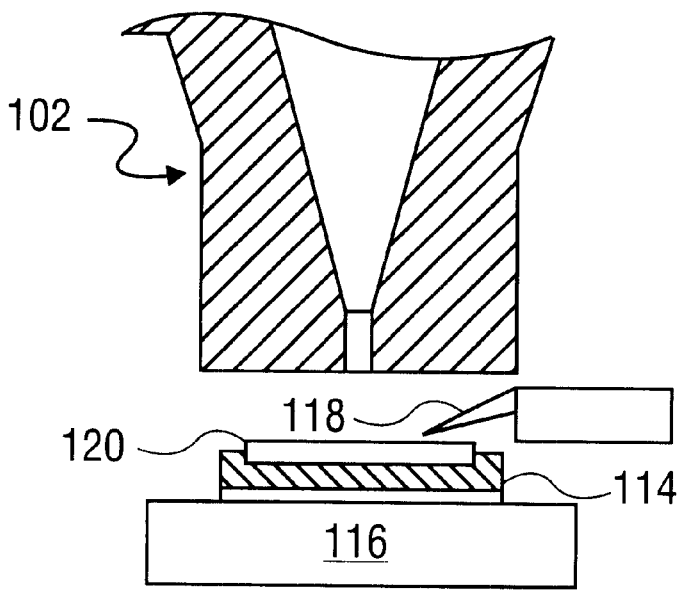

Another embodiment of the invention is shown (in part) in FIG. 2. The system comprises a modified Schlumberger IDS 10000 scanning electron column/electron spectrometer, of which only the objective lens end of the column is shown (indicated by numeral 100) and includes a column objective lens 102, a secondary electron detector 104 and an energy discriminator 106 connected to a voltage source v which can be set to determine the energy of secondary electrons reaching the detector 104. The system also includes a flood gun 108 with an Einzel lens (not shown), a bias electrode grid 112 connected to a voltage source v, a sample plate 114, and a modified Schlumberger MWS wafer stage 116. FIG. 2(a) shows a part-view an alternative version in which voltage is applied with mechanical probes 118 using a modified Schlumberger's MPC mechanical probe station. This system employs only one bias electrode for both GCCM and LCCM. When using the mechanical probe 118, the bias electrode 112 has to be removed because it blocks the mechanical probe from probing the wafer 120. During the operation of GCCM, a large intensity of the secondary electrons can blind the detector 104. To prevent this, a metal plate (called flooding mask) 122 with a large hole is placed near the entrance of the objective lens 100 and connected to a voltage source v. A negative voltage can be applied on this electrode during flooding to prevent secondary electrons from entering the detector 104. Alternatively, a grid 132 can be placed in front of the detector 104. A negative voltage can be applied to this grid during flooding to prevent secondary electrons from entering the detector 104.

The mechanical probes 118 are optional and are used to apply positive or negative potential to selected conductors on the wafer. The voltage contrast due to the external potential can also be used to find defects which, otherwise, can not be found using the charge control unit. For instance, when a metal line is connected to the substrate with a 100 kilo-ohms resistance, the large leakage current will make it impossible to charge the structure to any significant voltage using the GCCM or LCCM to display voltage contrast. In this case, the mechanical probers can then be used to insert, say 1 volt to the conductor while the wafer voltage contrast is inspected.

Instances of the use of the present invention are given in the example below:

1. Charge Control

Figure 3:
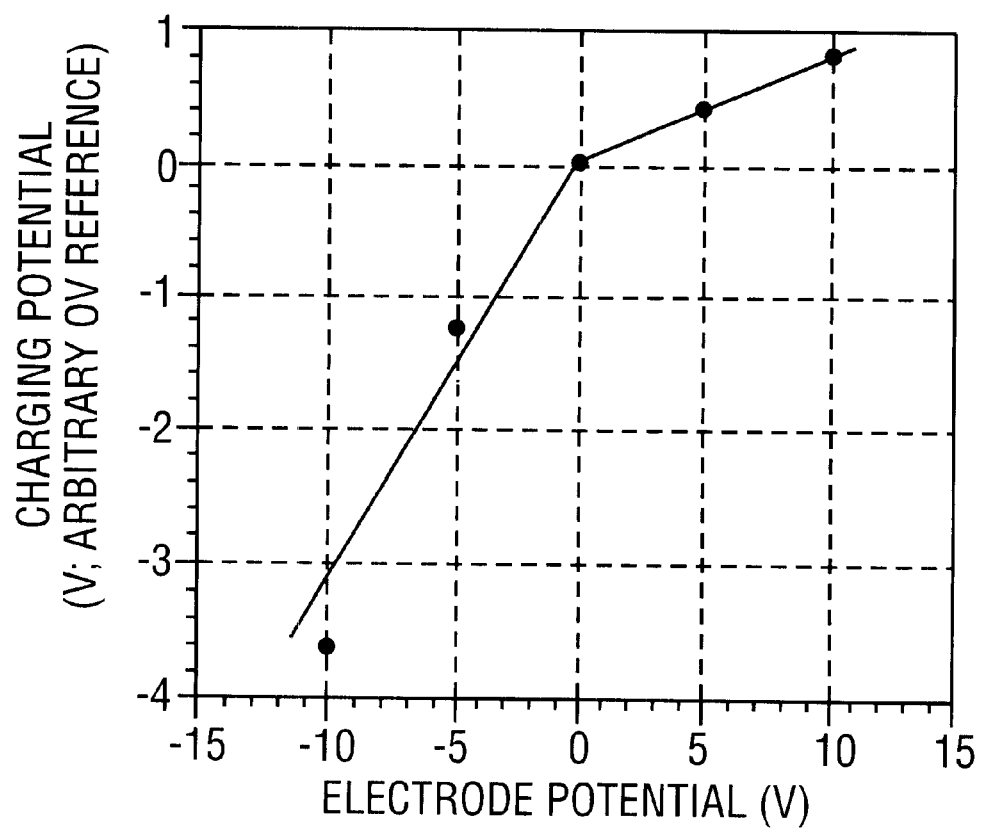
FIG. 3 shows the charge-up potential of a floating conductor as a function of bias electrode voltage.

In FIG. 3, the final charge-up potential of a floating conductor is shown as a function of the bias electrode. The charging potential on the floating conductor is estimated by comparing the image contrast of the floating conductor and a neighboring conductor connected to an external, adjustable power supply. The charging potential is equivalent to the power supply voltage when both conductors appear to have the same contrast.

2. Local Charging

Figure 4A:
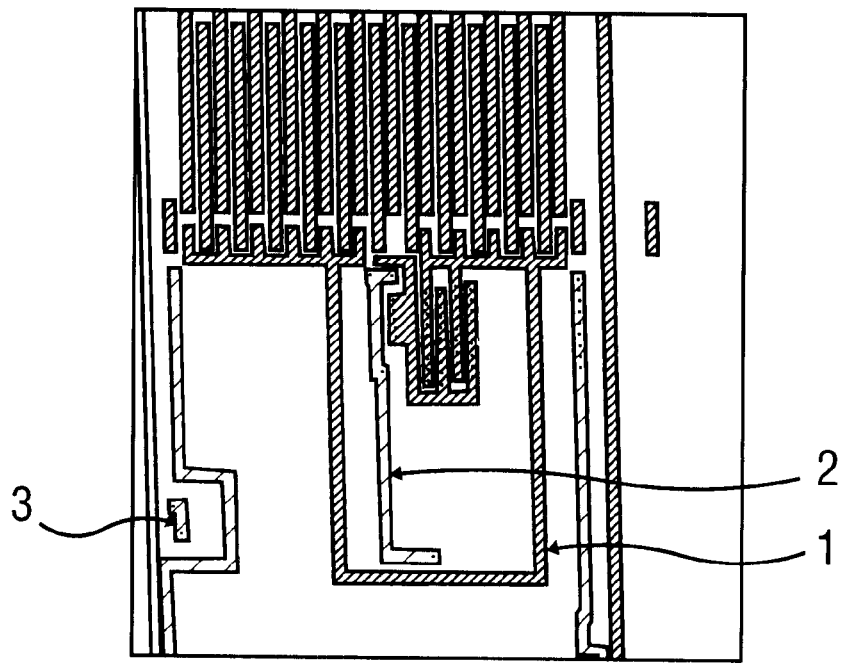
FIGS. 4(a), 4(b) and 4(c) show SEM images of a micro-circuit before and after charging and the equivalent circuit diagram.
Figure 4B:
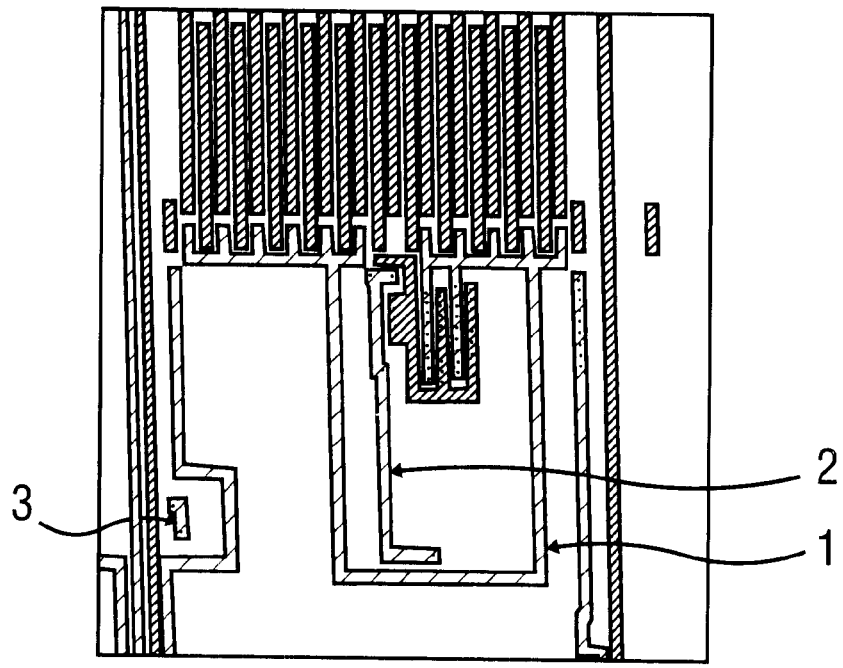

To demonstrate the applications of using LCCM on inspection of partially finished micro-circuit, two SEM images taken of a micro-circuit are shown in FIGS. 4(a) and 4(b). The two images display very different voltage contrast because FIG. 4(a) was taken without charging the x conductor (marked) while FIG. 4(b) was taken after charging the conductor. Charging the x conductor results in structures 1, 2 and 3 switching states from ground to floating or vice versa. The two images can be used to compare to that taken of a reference die. Any deviations signals a defect in the circuit.

3. Positive/Negative Charging Provide Complementary Information

Figure 5A:
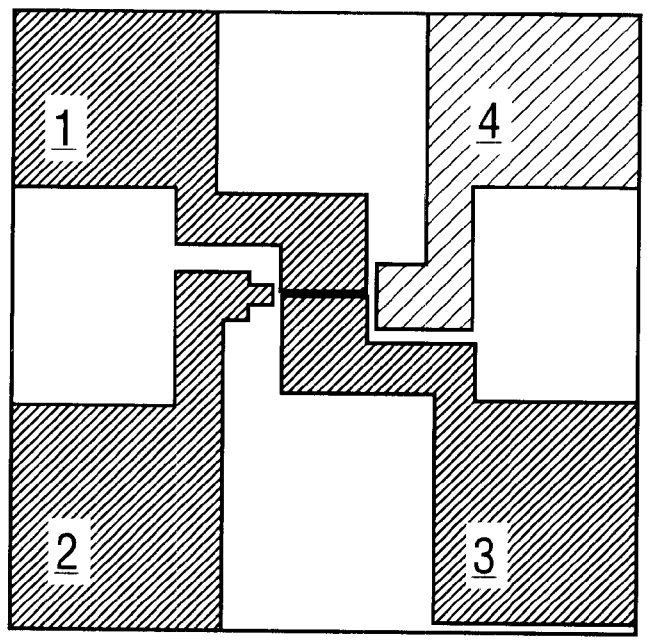
FIGS. 5(a) and 5(b) show SEM images of a micro-circuit with positive and negative potential charging.
Figure 5B:
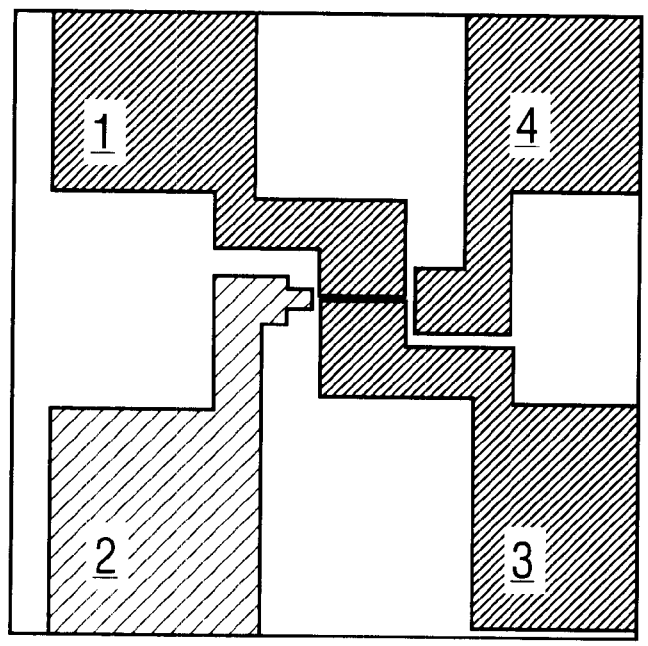

The effectiveness of combining positive and negative voltage contrast can be realized by comparing the SEM images taken of a micro-circuit while operating the LCCM at positive and negative charging modes, respectively. The images clearly show that the three square pads (pad 1, 2 and 3) have the same positive voltage contrast (FIG. 5(a)). However, they do not display the same negative voltage contrast (FIG. 5(b)). The difference, in fact, are due to different connections (not visible on the image) to these pads. In table 1, the +/- voltage contrast of metal connectors at different connection arrangement is summarized. According to the table, we can determine that pads 1 and 3 are connected to a n diffusion on p substrate, pad 2 is floating, and pad4 is grounded. Note that if there were a broken connection between pad 1 or 3 and the diffusion (therefore, it is floating), it can be easily observed in the negative voltage contrast image because its voltage contrast image would have been brighter rather than darker than rest of the pads. On the contrary, the defect can not be detected via the positive voltage contrast because it does not display a different contrast whether its connection is broken or not.

TABLE 1

Summary for metal conductor voltage contrast at different conditions

|  | floating | grounded | n diffusion/ p substrate | p diffusion/ n substrate |
|---|---|---|---|---|
| + voltage | darker | brighter | darker | brighter |

TABLE 1-continued

Summary for metal conductor voltage contrast at different conditions

|  | floating | grounded | n diffusion/ p substrate | p diffusion/ n substrate |
|---|---|---|---|---|
| contrast – voltage contrast | brighter | darker | darker | brighter |

4. Open/short Inspection Involving the Charge Control Unit (a) CMOS Poly Gate/poly Inter-connect After the deposition of poly gate, the integrity of the field oxide can be examined by charging the surface to a predetermined positive or negative voltage using the charge control unit. Poly gate is expected to hold charge in either polarities and the poly gate should show up differently in voltage contrast to the surrounding material. This makes it possible to check whether the gate meets the forward and reverse bias specification.

This invention also enables the measurement of the resistance of a leaky gate. A normal operating gate has an extremely high resistance (>1 giga ohms). If a leaky gate has a resistance that is not too low (>50 mega ohms), the gate poly can be charged to a predetermined voltage (say 0.1 V relative to the substrate) using the LCCM. The leakage current can then be measured by connecting the sample plate to a pico-ammeter. The resistance can be derived by dividing the charged voltage by the leakage current. The maximum measurable resistance is limited by the measurement range of the pico-ammeter. The least measurable resistance, on the other hand, is set by the maximum injecting current of the LCCM. A low resistance (resulting in a large leakage current) prevents the beam from charging up the gate to any controllable, predetermined voltage. The measurable resistance should be between tens of mega- to thousands of giga-ohms using this method.

(b) CMOS Diffusion Contact:

For those MOS transistors fabricated on the substrate without the well isolation, the integrity of the contact/diffusion for the drain and source can be examined using the invention.

Figure 6:
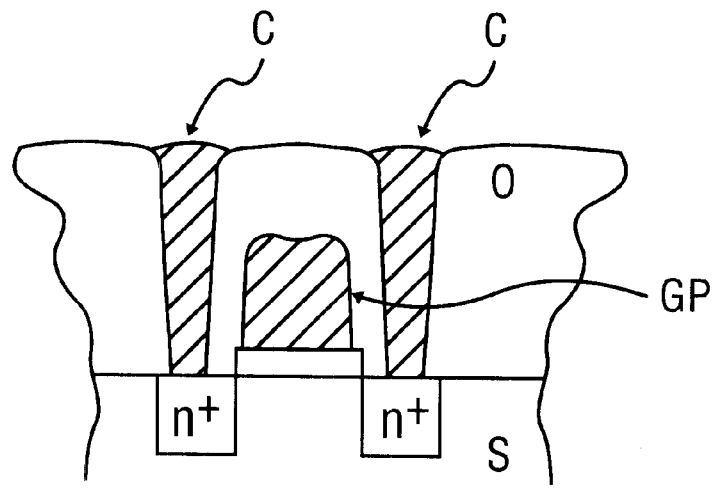
FIGS. 6, 6(a) and 6(b) show schematic views of an NMOS transistor on p-substrate with positive and negative charging.
Figures 6A, 6B:
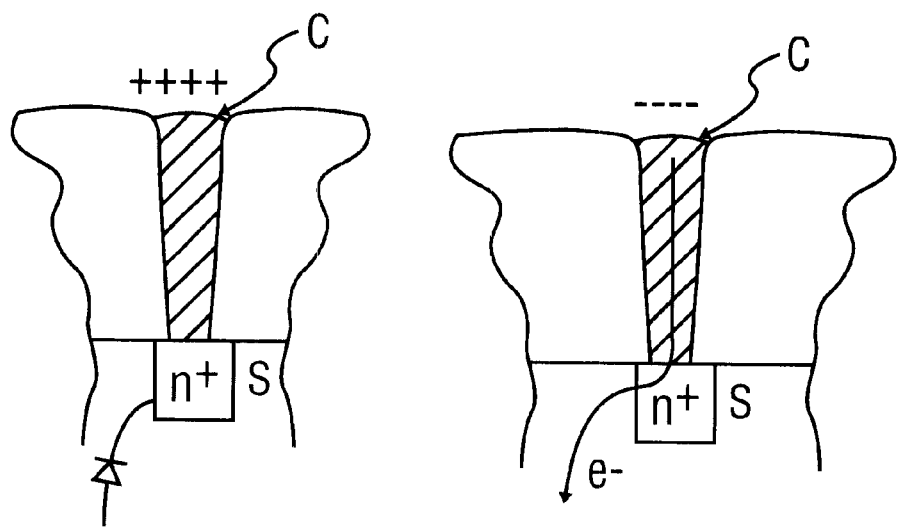

(i) NMOS transistor on p-substrate (FIGS. 6(a) and 6(b))—The surface is charged up positively using the GCCM. The voltage contrast of the drain/source contacts C (extending through the oxide layer O either side of the gate poly GP) is inspected. All of these contacts C are not conducting to the substrate S because of the presence of diffusion n+ (a pn junction between the substrate and the diffusion). Therefore, the contacts C should charge up because the junction is reverse biased (FIG. 6(a)). Any non-charged contacts indicate a problem in the diffusion. The surface is then charged up negatively and the contacts are examined again (FIG. 6(b)). Because a forward bias is established between the contact and the substrate when charging the contacts negatively (the charge e is drained through the substrate), this time the contacts are expected to be uncharged. Any charged contacts indicate open fault between the contacts and diffusions.

(ii) PMOS on n-substrate without the isolation well—This uses a similar mechanism to that described above. When the surface is charged positively, a forward bias is established between the p-diffusion and the n-substrate. The charge in the contract is drained through the substrate. Therefore, a good normal contact should be uncharged. On the other hand, when the surface is charged negatively, a normal contact is charged because of a reverse bias between the contact and the substrate.

(iii) Substrate contacts—the dual voltage contrast (using GCCM) can be applied for the inspection of the substrate contacts. The substrate contacts should be uncharged after either polarity flooding because the charge is drained through the substrate. Any charged substrate-contacts indicate an open fault.

(iv) small isolated well contacts—In case of a small, isolated p-well on n substrate, the contacts should charge up when flooding negatively; otherwise it is a leaky well. When flooding positively, the well contact should be uncharged because of forward bias to the substrate; otherwise there is an open between the contact and the well diffusion. For n-well on p substrate, the contacts should charge up when flooding positively but uncharged when flooding negatively. For n-well on n substrate or p-well on p substrate (for the case of twin-well technology), the contacts should remain uncharged after either flooding.

(v) contacts to large isolation well—It is common to have devices in which numerous transistors share a large well, for instance, SRAM cells in memory chips. The outcome of inspecting a large well significantly differs from that of a small isolation well. The leakage current through a large well (either n well on p substrate or a p-well on n substrate) can be so large when the well and the substrate are reverse-biased; therefore, the well can not be charged up. Under this circumstance, all good normal well contacts should remain uncharged after either polarity flooding.

(vi) Inspection of drain/source diffusion contacts for a large well isolated MOS transistor—As discussed previously, a large well can not be charge up significant enough using a focused charge particle beam. The well can be considered as if it were the substrate (or just ignore its presence). The results are the same as inspection of drain/source diffusion contacts on substrate which has been previously discussed.

Figure 7:
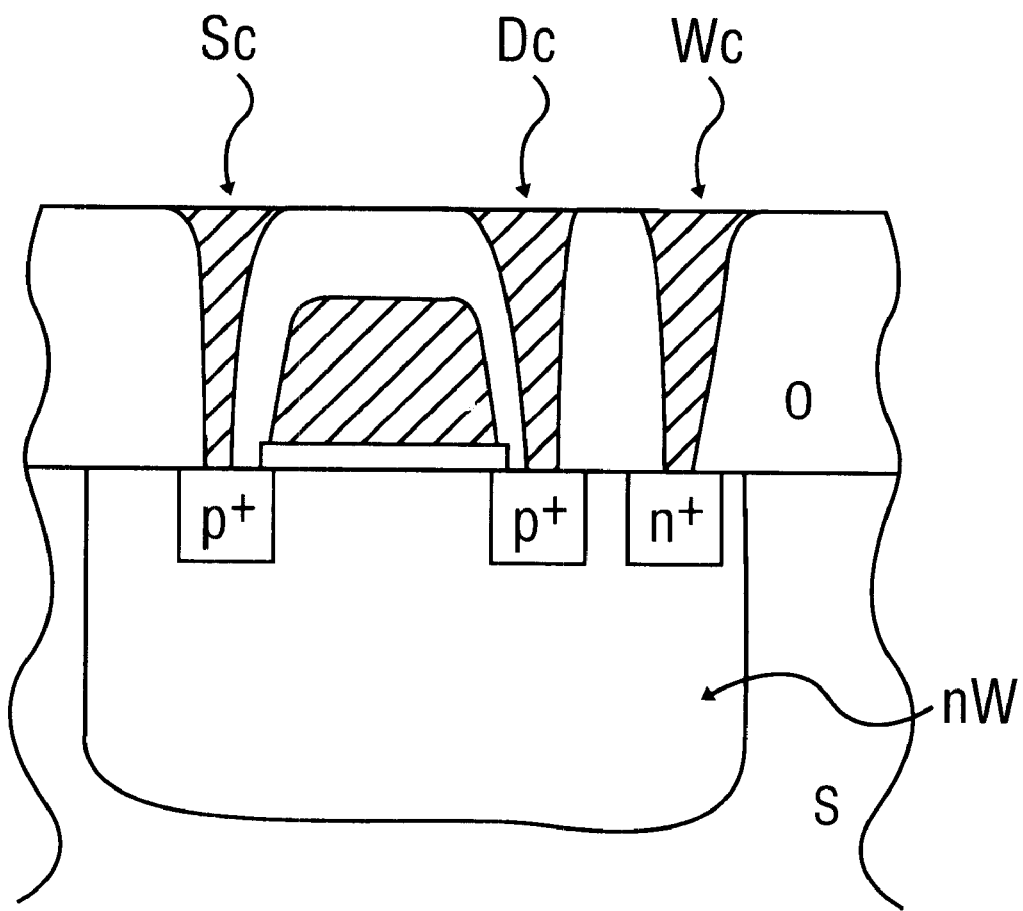
FIG. 7 shows a schematic view of a small well isolated MOS transistor.

(vii) Inspection of drain/source diffusion contacts for small well isolated MOS transistors—this is more complicated because a p-n-p or n-p-n junctions exist between the diffusion, the isolation well, and the substrate (FIG. 7). In this case, LCCM has to be used to locally charge-up the contacts for voltage contrast inspection. For inspecting a PMOS transistor in n-well, the well contact WC is charged negatively before the drain and source contacts DC, SC are inspected. For a normal cell, the source/drain contacts should charge up because of a forward bias between well nW and the source/drain diffusions p+. Any uncharged source/diffusion contacts signal open faults between the contacts DC, SC and diffusions p+ or open faults between the well contacts WC and well nW; the latter possibility can be confirmed by the well contact inspection previously discussed. On the other hand, when charging the drain/source diffusion contacts DC, SC negatively, the well contact WC should remain unaffected because of the reverse bias; otherwise, it signals a bad diffusion. A different inspection approach can also be used to derive the same conclusions: First, positively charge the drain (or source) contact DC (SC), then inspect the voltage contrast of the well contact WC. This approach, however, will take more steps to complete the same test. In case of inspecting a PMOS in n-well, first charge well contact negatively, then inspect the voltage contrast of the source and drain contacts. The source and drain contacts should also charge up because of forward bias between the diffusion and the well. When charging the well contact positively, the source/drain contacts voltage contrast should be unaffected if the diffusions are functioning.

(c) Bi-polar Diffusion Contacts

Figure 8:
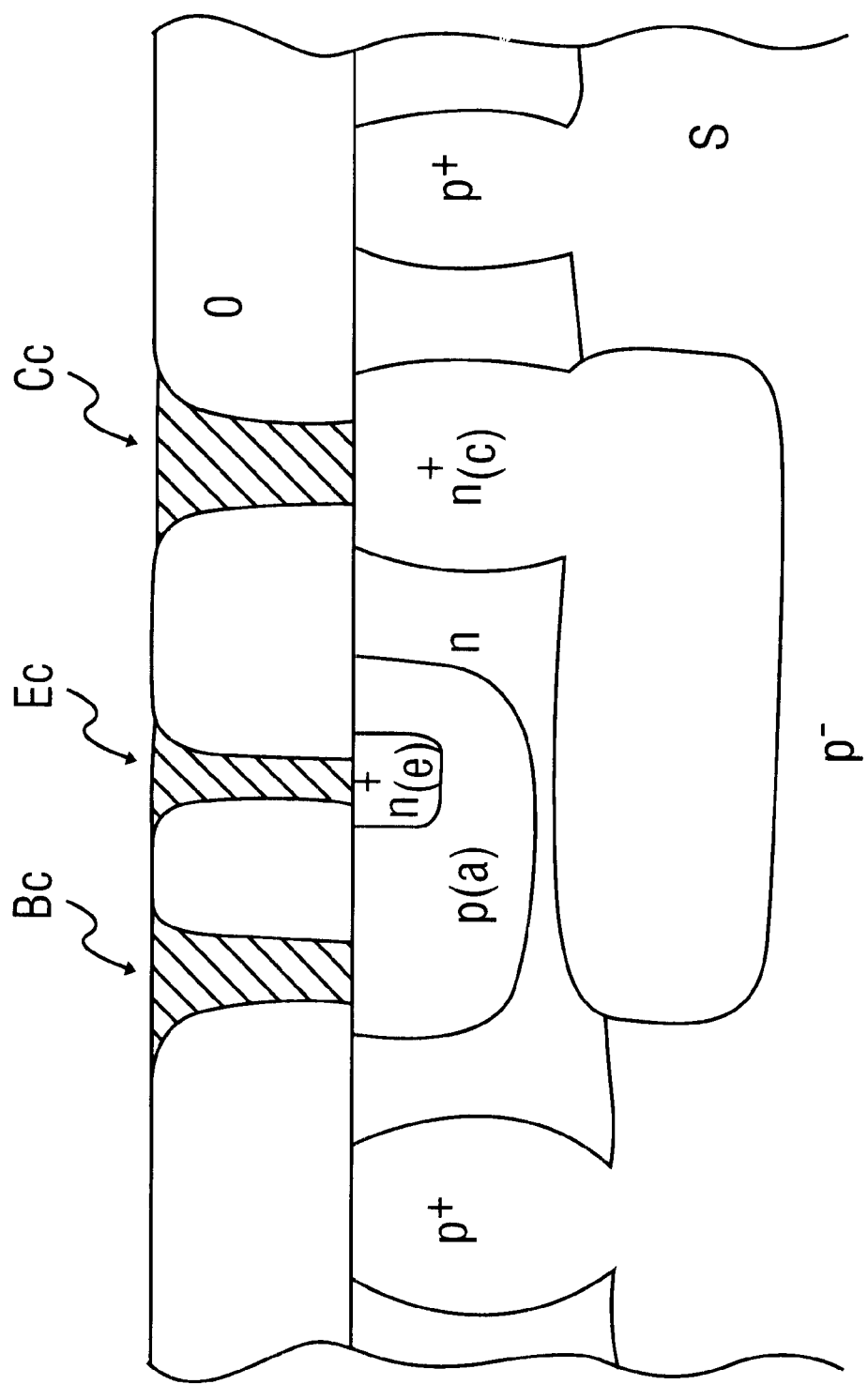
FIG. 8 shows a schematic view of an npn transistor.

The application of the invention is similar to the techniques for probing the MOS contacts described above, the contacts of bi-polar transistors can be inspected using the dual voltage contrast concept. For example, inspection of npn transistors—As illustrated in FIG. 8, an n-diffusion n+(c) is fabricated on the p-substrate S to serve as the collector as well as device isolation for the transistor. When flooding positively using the GCCM, the collector (and its contact CC) should charge up due to the reverse bias between the diffusion n+(c) and the substrate S; otherwise, it indicates a leaky isolation. When flooding negatively, the collector should not charge up because the current is drained to the substrate (forward bias); otherwise, it indicates an open fault between the collector contact and its diffusion. Due to the existence of p-n-p junctions between the emitter n+(e), the base p(b) and the substrate S, the contacts EC, BC to the emitter, and base diffusions should remain charged when they are flooded at either polarities with GCCM. This, however, does not reveal any broken connections between the contacts and diffusions. To detect this type of defect, first, the LCCM has to be used to selectively charge the base to a positive potential. Due to a forward bias between the emitter and the base and between the emitter and the collector, the emitter and the collector contacts should consequently charge up. If the collector contact does not charge up and the collector contact has been previously confirmed functional, an open fault exists between the emitter contact and its diffusion. If the base contact does not charge up and the emitter contact has been previously confirmed functional, an open fault exists between the emitter contact and its diffusion.

(d) Contacts for bi-CMOS

By combining those techniques used on CMOS inspection and bi-polar inspection, Bi-CMOS devices can also be inspected. Inspection of the CMOS portion of the circuit is identical to that of a CMOS transistor while inspection of the bi-polar portion is the same as that of bi-polar.

(e) Metal 1-Contact Connections

Figure 4C:
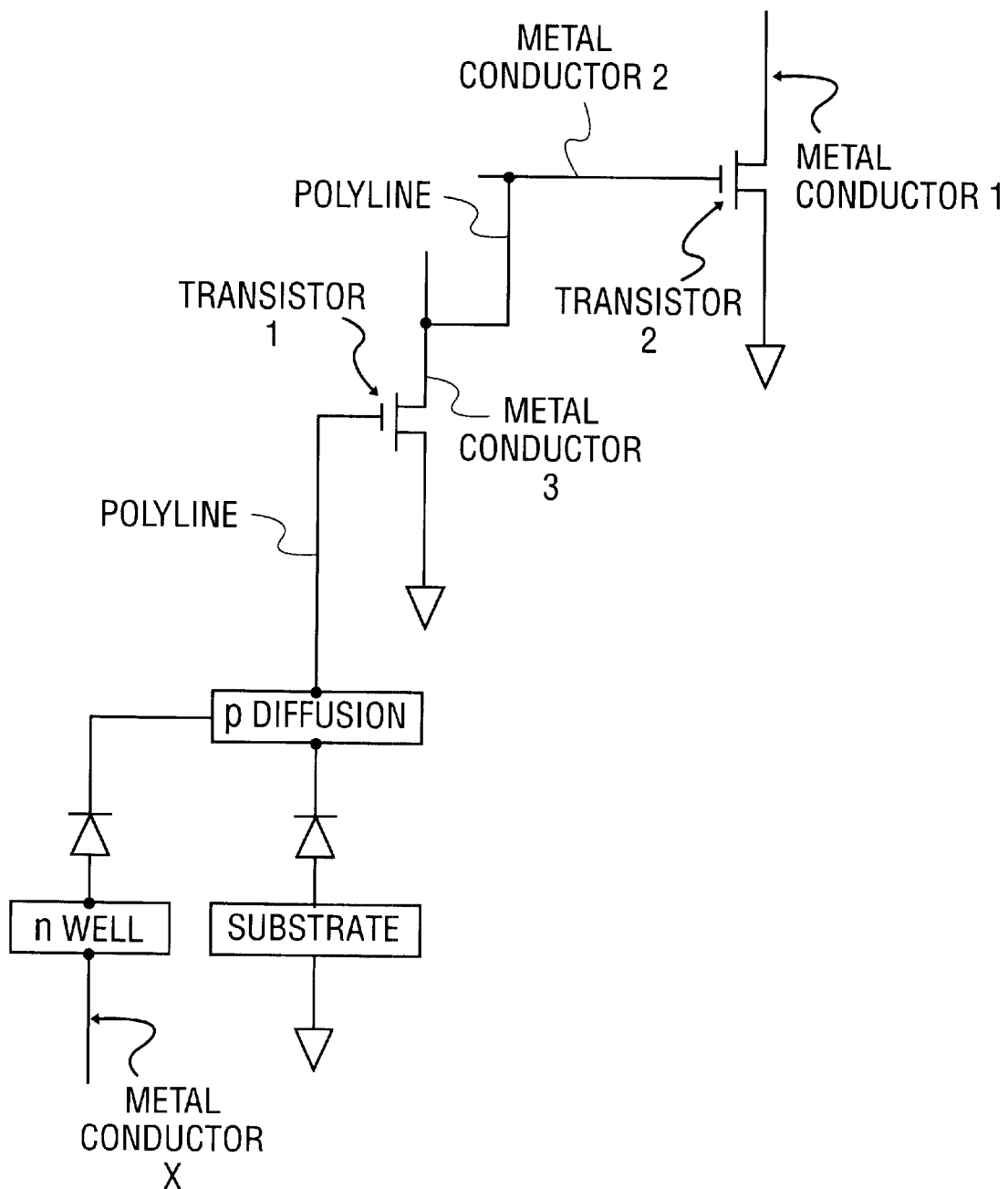

The rule of thumb of detecting defects at this process level is via good die/bad die or neighboring die comparison rather than predicting the voltage contrast based on the CAD design. Metal 1 is commonly used to interconnect the diffusion contacts, well contacts, or gate poly contacts. It can be considered as the extension of the contacts, and therefore can be examined based on the same principles introduced for contact inspection. However, due to the likelihood of a single metal line connecting to multiple contacts, it is much more complicated to predict the voltage contrast of the metal lines than individual contacts. An example can be seen in FIGS. 4(a) and 4(b) where the microcircuit is processed at metal 1. By charging conductor x, a chain of metal lines switch states. This observation can be explained using transistor electronics. The equivalent circuit diagram of this conductor net is illustrated in FIG. 4(c) (Note that many of the connections are via polylines, which are not visible in FIGS. 4(a) or 4(b)). Charging conductor x, in fact, controls on/off of the transistors 1 and 2. When conductor x charges up (positively), the n-well also charges up because of reverse bias; the p-diffusion floating on top of the well also charges up. The transistor 1 turns on because its gate is connected to the p-diffusion. Conductors 2 and 3 switch from floating to grounded state then turns off transistor 2, which floats conductor 1. When discharge conductor x, transistor 1 is turned off, which floats conductors 2 and 3, in turn, switch on transistor 2 and ground conductor 1.

(f) Isolation of the Invisible Resistive Bridging Between Metal Lines

As device dimension shrinks, a new type of defects is found: invisible resistive bridging between densely packed metal lines (especially in metal 1 and 2). The invisible resistance can result from processing residuals, particle contaminants, or fine hair-line metal bridging. These types of defects are extremely difficult to find because (1) their physical size is beyond optical resolution and can only be visible under high resolution SEMs at very high magnification, and (2) when viewing under an SEM, the defect material contrast is very similar to that of the insulation material (e.g. silicon oxide). This type of defect, however, is easier to locate using the invention. For the inspection of floating metal lines, LCCM is first used to locally charge one of the metal lines to a predetermined potential which is sufficient to enhance the voltage contrast of the metal lines. The resistive defects and the rest of the shorted metal lines should also charge to the potential. A voltage contrast image will be taken of the metal lines to locate the bridging defects. Note that these defects are more visible in a voltage contrast image because (1) distinctive voltage contrast exists between the resistive residual defects (charged) and the insulation material (uncharged), and (2) the defect size (potential) in voltage contrast extends beyond the physical size of the actual defect. When inspecting metal lines which are grounded to the substrate, GCCM can be used to charge up the entire surface. The sharp contrast between the insulation (charged) and the defects (uncharged) helps to locate the defects.

(g) Via-metal Line Connection

Vias can be examined using the invention system at high throughput: those vias connecting to underlying metal lines which are either shorted or forward biased to the substrate during flooding. First, the surface is flooded using the GCCM with the polarity which results in a forward bias. The vias should be uncharged because all the charges are drained through the metal lines to the substrate. Those vias retaining charge are open vias. For vias connecting to metal lines which are electrically isolated from the substrate (after flooding with either polarity), LCCM has to be used for the inspection. First use LCCM to locally charge up a via, then inspect the voltage contrast of other vias connecting in the same net. If the rest of the vias are not charged, the first via is open. On the other hand, if only a portion of the vias in the net are not charged, those vias are open vias.

(h) Higher Level Metal Lines

The inspection of higher metal lines are similar to that of metal 1. As it may be difficult to predict the voltage contrast of the metal lines by reviewing the design file, a good die/neighboring die comparison may be more appropriate to identify any defects.

Figure 9A:
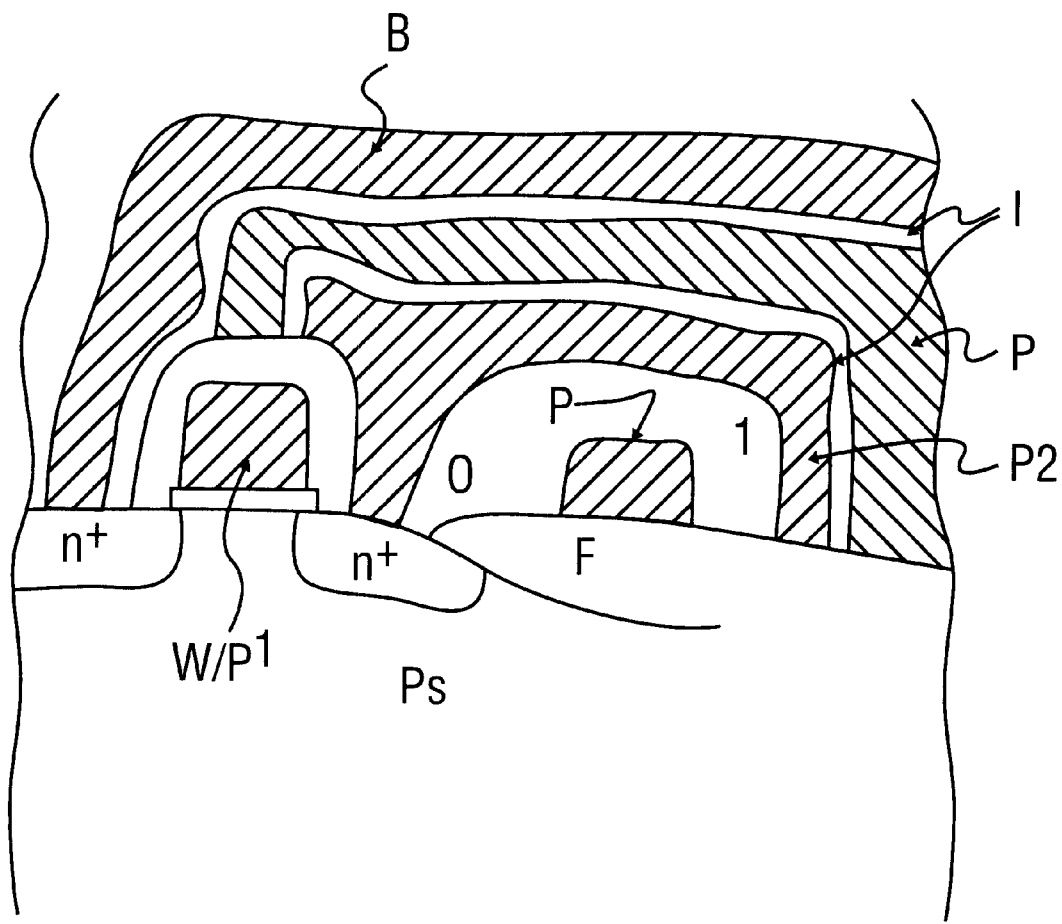
FIGS. 9(a) and 9(b) show a schematic view of a DRAM cell and its equivalent circuit.
Figure 9B:
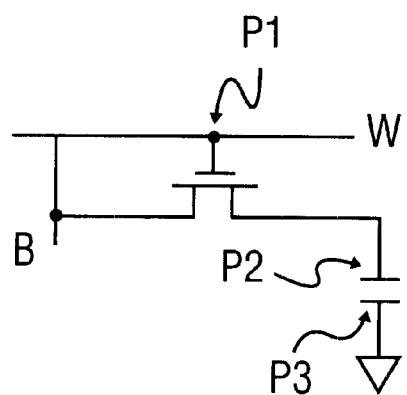

(i) Multiple Poly Lines/high Density DRAM Multiple poly lines are commonly used in DRAM fabrication for constructing the capacitor and local interconnects. The connections of these poly lines to the diffusions and connections to each other can be inspected. As an example, the inspection of a 1-T DRAM fabricated based on NMOS technology will be discussed. The cross section of a DRAM cell is illustrated in FIG. 9(a) (its equivalent circuit is shown in FIG. 9(b)).

After the fabrication of word line (poly 1) W/p1 is completed, it can be inspected using the same technique as previous discussed for MOS gate poly. After poly 2 p2 is completed, its connection to the diffusion n+ can be inspected by charging the surface negatively using the GCCM. The poly line is expected to be uncharged because any charges should drain to the substrate through the diffusion (forward bias to the substrate); otherwise, the poly 2 is open to the diffusion. When positively charging the surface, the poly 2 line is expected to charge up because of reverse bias against the substrate; otherwise, it indicates a leaky diffusion. Poly 3 p3 is the counter electrode of poly 2; together, they form the storage capacitor. Poly 3 is expected to be grounded to the substrate; therefore, should never charge up after either polarity flooding.

The functional of a DRAM cell can also be inspected by this system after the fabrication of the polycide bit-line; one of the concerns is shorts between the polycide, the poly 2, and the poly 3 since they are separated by a thin insulation layer (~10 nm) I. Firstly, the surface is positively charged using the GCCM; the chosen potential should be high enough to switch on the word line. For a proper operation cell, charge should also be deposited into the poly 2 during the flooding; current is injected from the bit line B through the word line gate. Then GCCM is used again to neutralize the surface charge. There is residual charge stored in the capacitor because the gate switches off before the neutralization flooding can empty all the charge in the capacitor. Thirdly, LCCM is used to positively charge the word line to close the gate switch so that the residual charge in the capacitor can flow back to the bit line. The bit line voltage contrast is inspected to check if the charge storage actually works.

5. Functional Analysis Involving the Charge Control Unit (a) Transistor Functional Test The transistor switching function can be quickly inspected using the invention system before the completion of the device. As an example, The inspection of an isolated NMOS transistor (FIG. 6) will be discussed. First, the LCCM is used to positively charge up the drain of the transistor. The voltage contrast on the source is then inspected. If the source is charged up, it indicates a leaky switch. The LCCM is then be used to charged up the gate to close the switch ("on" state). The source voltage contrast is again inspected; the source should be charged; otherwise, the "switch" is not functioning.

(b) Threshold Switching Voltage Test

A defective transistor can be semi-functional but does not switch "on" at the designated threshold voltage. The testing of the threshold voltage can be accomplished using the invention. As has been discussed previously, using the LCCM, a conductor can be selectively charged to a predetermined voltage and the transistor switching can be monitored. To determine the transistor switching threshold voltage, the system can inspect the transistor switching (on or off) while ramping the charge-up voltage; here the system alternates charging and probing. The threshold voltage is the voltage at which the system detects the transistor switching.

6. Multiple Good References

To catch defects, inspection data are compared to reference data collected from a good die or from a neighboring die. In conventional inspection systems, only a single reference datum is used for each inspection. Using only a single datum reference can result in numerous false alarms. For instance, when evenly charging up a flip flop or an SRAM, the voltage contrast of the device is unpredictable because it can settle either to "0" or "1" just as the situation of initial powering up a memory chip. In this case, there will be two sets of "good" voltage contrast. To determine a fault, the inspection data has to differ from both sets of references. The general algorithm includes multiple references to consider situations of device with multiple random states during initial flooding. A fault is determined only when the inspected data matches none of the references.

7. Inspection of Resistivity Connections

The current leaking into the substrate through a resistive contact can be measured by connecting the sample plate to a pico-ammeter. The resistance is the ratio between the charged potential and the leakage current. The details can be found in previous discussion related to inspection of CMOS gate.

8. In Conjunction with Mechanical Probes

As has been discussed previously, voltage contrast inspection requires the charging potential to be maintained while the wafer is inspected. Setting potentials using the charge control unit is limited to structures that are well insulated or highly resistive to the substrate. To persistently maintain a potential in some cases, external voltage sources need to be inserted into the device using mechanical probers. For instance, to power up the Vdd of a device while inspecting the voltage contrast across the device, a large current (e.g. several mA) may required; this current will be very difficult to be supplied by a charged particle beam. It is optional for the invention system to equip four micro-probers for this application.

9. Network Capacitance Inspection

Some circuit faults are difficult to determine by voltage contrast inspections. For instance, it is difficult to catch the shorts between two metal lines, one of which is buried deep under the surface. The capacitance measurement technique will, however, make possible to detect such a short. The capacitance of a single conductor line differs from that of two shorted conductors. By detecting the variation of capacitance change, even buried shorts can be detected. Similarly, a conductor with a broken section will also show a reduction of its capacitance. To measure the capacitance of a conductor, the LCCM is used to locally charge up the conductor to a pre-set potential and the charge-up time is measured. Since the charge up time is proportional to the size of the capacitance, the capacitance unit is this system is in "time". To determine if the surface has reached the charged up potential, the secondary electron emission is monitored. Note that the surface charging potential can be directly related to the collected secondary electron intensity. The timer is started at the beginning of the charging and stopped when the secondary intensity goes beyond (when charging negatively) or below (when charging positively) the threshold intensity.

10. Temperature Specification Testing

Many semiconductor devices have temperature specifications. A device which functions properly at room temperature may not meet the specification at a higher or lower temperature. It is easier to find the root cause of failing the temperature specification at an early stage of the fabrication. As has been discussed previously, this system allows location of open and short faults, inspection of gate oxide forward and reverse bias, and the conducting of functional testing on a transistor. It is optional for this system to be equipped with a temperature controlled sample plate so that the same inspections can be conducted at different temperatures. It is also optional for this system to have a separate thermal-shock chamber in which the test wafers can be cycled through the upper and lower temperature limits before they are inspected by the system.

11. Inspection Efficiency Monitoring

The inspection procedures according to this invention can be executed at different wafer fabrication stages. The percentage of killer defects detected for each inspection can monitored by and displayed to the user. This allows identification of low efficiency procedures which can then be examined for possible improvements. The accumulated inspection knowledge can be stored in a system data base. Based on the accumulated knowledge, the system will eventually be able to recommend inspection procedures.

12. Beam Induced Contamination Control

Beam induced contamination (polymer deposition known as "carbon cracking") is deposited on the wafer during inspection. The deposition on device can cause a failure on unpassivated devices. It is optional for the invention system to be equipped with a temperature control sample plate. By heating the wafer to a high temperature (~300° C.) or cooling to a low temperature (below 0° C.), the contamination can be greatly reduced. Moreover, the system can also equip an oxygen/$XeF_2$ gas nozzle (nozzle that similar to that used in Schlumberger P2X focused ion beam system). By applying gas beam onto the beam irradiating area, carbon polymer can be removed due to beam assisted chemical etching reactions.

13. Focused Ion Beam Systems

A similar system to that described above can be constructed by replacing the scanning electron beam with a focused ion beam. The same techniques which do not involve the LCCM as previously described, however, will not work for negative charging for this system because the focused ion beam alone cannot charge the surface negatively. The advantage of using focused ion beam is the ability to construct connections or introduce isolations in situ; this makes it a convenient tool for failure analysis, root cause investigation. The sputter nature of the ion beam, however, is not favored for the applications of in-line inspections and it can not locally charge to a negative potential.

We claim:

1. A method of testing a semiconductor structure having one or more active devices electrically connected to pn junctions formed with diffusion regions in a substrate of the semiconductor structure, comprising:

a) charging a surface of an element of the semiconductor structure with an electron-beam, where an electron-beam voltage is between two crossovers of surface secondary electron emission of the element;

b) applying an electric field perpendicular to the surface of the semiconductor structure while charging to cause negative charging of the element;

c) interrogating the surface of the structure including the element with a further electron-beam to obtain voltage contrast data for the surface of the structure; and d) analyzing the voltage contrast data to determine a functionality of the element.

2. A method as claimed in claim 1, comprising using the electron-beam to flood an area of the surface of the structure which encompasses the element with electrons.

3. A method as claimed in claim 1, comprising using the electron-beam to apply a focused beam of electrons to the surface of the element.

4. A method as claimed in claim 1, wherein the step of charging with an electron beam comprises applying a first electron-beam to charge to an area of the surface of the structure and applying a focused electron-beam to a surface of the element.

5. A method as claimed in claim 1, wherein the step of applying an electric field comprises providing an electrode spaced from the surface and applying a voltage between the structure and the electrode.

6. A method as claimed in claim 5, wherein the structure is positioned on a plate and the voltage is applied between the electrode and the plate.

7. A method as claimed in claim 1, comprising obtaining the voltage contrast data in the form of an image.

8. A method as claimed in claim 1, comprising obtaining the voltage contrast data in the form of a one-dimensional profile.

9. A method as claimed in claim 1, wherein the step of analyzing the data comprises comparing the data to reference data such that newly acquired data are compared to a plurality of reference data, a defect being determined when the newly acquired data differ to all of the reference data.

10. A method as claimed in claim 1, further comprising reducing beam induced contamination by controlling the temperature of the semiconductor structure during testing.

11. A method as in claim 10 wherein the temperature is below 0° C.

12. A method as in claim 10 wherein the temperature is approximately 300° C.

13. A method as claimed in claim 1 wherein the element is conductive.

14. A method of detecting defects in a semiconductor structure comprising:
    a) charging negatively a surface of at least part of the semiconductor structure with an electron-beam, while applying an electric field to the semiconductor structure to control charging potential, where the electron-beam has a voltage between two crossovers of surface secondary electron emission of the surface of the at least part of the semiconductor structure;
    b) detecting secondary electrons from the surface of the semiconductor structure to obtain voltage contrast data and
    c) analyzing the voltage contrast data to detect defects in the semiconductor structure.

15. The method of claim 14 where the step of charging negatively is self regulating.

16. The method of claim 14 where the voltage contrast data is in the form of an image.

17. The method of claim 14 where the voltage contrast data is in a form of a one-dimensional profile.

18. The method of claim 14 where the analyzing step is comprised of comparing the voltage contrast data with reference data.

19. The method of claim 14 where the analyzing step is comprised of comparing the voltage contrast data with reference data from a neighboring die.

20. A method of detecting defects in a semiconductor structure comprising:
    a) charging a surface of at least part of the semiconductor structure with a first polarity charge;
    b) charging the surface of the at least part of the semiconductor structure with a second polarity charge;
    c) detecting secondary electrons from the surface of the semiconductor structure to obtain voltage contrast data and
    d) analyzing the voltage contrast data to detect defects in the semiconductor structure.

21. The method of claim 20 wherein the second polarity is reversed with respect to the first polarity.

22. The method of claim 20 wherein charging steps a) and b) comprise exposing the surface to an electron-beam.

23. The method of claim 20 wherein charging steps a) and b) comprise exposing the surface to an electron-beam, where the electron-beam has a voltage between two crossovers of surface secondary electron emission of a surface of the at least part of the semiconductor structure.

24. The method of claim 20 wherein charging steps a) and b) comprise applying an electric field to a surface of the semiconductor structure to control charging polarity.

25. The method of claim 20 wherein charging steps a) and b) are self regulating.

26. A method of detecting defects in a semiconductor structure comprising:
    a) charging a surface of at least part of the semiconductor structure to a first potential;
    b) detecting secondary electrons from the surface of the semiconductor structure to obtain voltage contrast data at the first potential;
    c) charging the surface of the at least part of the semiconductor structure to a second potential;
    d) detecting further secondary electrons from the surface of the semiconductor structure to obtain voltage contrast data at the second potential and
    e) analyzing the voltage contrast data at the first potential and the voltage contrast data at the second potential to detect defects in the semiconductor structure.

27. The method of claim 26 wherein the second potential is reversed in polarity with respect to the first potential.

28. The method of claim 26 wherein charging steps a) and c) are performed with an electron-beam.

29. The method of claim 26 wherein charging steps a) and c) are performed with an electron-beam, where the electron-beam has a voltage between two crossovers of surface secondary electron emission of the surface of the at least part of the semiconductor structure.

30. The method of claim 26 wherein charging steps a) and c) include applying an electric field to a surface of the semiconductor structure to control charging polarity.

31. The method of claim 26 wherein charging steps a) and c) are self regulating.

32. A method of testing a semiconductor structure having one or more active devices electrically connected to pn junctions formed with diffusion regions in a substrate of the semiconductor structure, comprising:
    a) charging a surface of an element of the semiconductor structure with a first electron-beam where a first electron-beam voltage is between two crossovers of surface secondary electron emission of the element;
    b) applying a first electric field perpendicular to the surface of the semiconductor structure while charging to cause a first polarity charging of the element;
    c) interrogating the surface of the structure including the element with a second electron-beam to obtain first voltage contrast data for the surface of the structure;
    d) charging the surface of the element of the semiconductor structure with a third electron-beam, where a second electron-beam voltage is between two crossovers of surface secondary electron emission of the element;
    e) applying a second electric field perpendicular to the surface of the semiconductor structure while charging to cause a second polarity charging of charged element;
    f) interrogating the surface of the structure including the element with a fourth electron-beam to obtain second voltage contrast data for the surface of the structure; and
    g) analyzing the first voltage contrast data and the second voltage contrast data to determine a functionality of the element.

33. The method of claim 32 wherein the first polarity and the second polarity are the same.

34. The method of claim 32 wherein the first polarity and the second polarity are different.

35. The method of claim 33 wherein the first polarity and the second polarity are negative.

* * * * *